(12) United States Patent
Abdollahian et al.

(10) Patent No.: US 6,342,812 B1
(45) Date of Patent: Jan. 29, 2002

(54) POWER AMPLIFICATION SYSTEM FOR LOW POWER RADIO FREQUENCY SIGNALS

(75) Inventors: Mehdy Abdollahian, Westford, MA (US); Peter Bacon, Salem, NH (US); Jean-Marc Mourant, Groton; Scott Munro, Wilmington, both of MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/604,253

(22) Filed: Jun. 27, 2000

(51) Int. Cl.[7] .................................................. H03F 3/68
(52) U.S. Cl. ........................ 330/124 R; 330/51; 330/53
(58) Field of Search ........................ 330/51, 53, 124 R, 330/151, 295

(56) References Cited

U.S. PATENT DOCUMENTS

| | | | | |
|---|---|---|---|---|
| 5,101,171 A | * | 3/1992 | Redmond | 330/53 |
| 5,146,614 A | | 9/1992 | Furuno | 455/89 |
| 5,175,871 A | | 12/1992 | Kunkel | 455/69 |
| 5,432,473 A | | 7/1995 | Mattila et al. | 330/133 |
| 5,530,923 A | * | 6/1996 | Heinonen | 330/51 |
| 5,661,434 A | * | 8/1997 | Brozovich et al. | 330/581 |
| 5,724,005 A | | 3/1998 | Chen et al. | 330/279 |
| 5,758,269 A | | 5/1998 | Wu | 455/127 |
| 5,929,643 A | * | 6/1999 | Aihara | 330/51 |
| 6,097,250 A | * | 8/2000 | Kamali et al. | 330/124 R |

FOREIGN PATENT DOCUMENTS

JP          57-211812       * 12/1982

OTHER PUBLICATIONS

IBM Tech Disclosure Bulletin "Automatic Tuning Controller for Anode Tuded Sputtering" Apr. 1977, vo. 17, Issue 11, pp. 4087–4088.*

* cited by examiner

*Primary Examiner*—Michael B Shingleton
(74) *Attorney, Agent, or Firm*—Connolly Bove Lodge & Hutz

(57) ABSTRACT

A power amplification system and method for generating low power radio frequency signals. A coupler divides a received signal to be amplified into first and second components. First and second driver stages individually amplify the first and second components. During a low power operation the first and second components of the divided signal are combined in a coupler. In a high power operation, the first and second components are supplied to first and second output amplifiers. The output amplifiers are interconnected so that the amplified signals are combined in the second coupler. The output amplifiers may be output at peak efficiency, using a constant input signal level during the high power mode of operation. During the lower power operation, the driver stages produce the output signal levels.

11 Claims, 2 Drawing Sheets

POWER AMPLIFICATION SYSTEM FOR LOW POWER RADIO FREQUENCY SIGNALS

BACKGROUND OF THE INVENTION

The present invention relates to low power telecommunications such as cellular telephones. Specifically, a power amplifier is provided for efficiently amplifying radio frequency signals at multiple power levels.

The popularity of wireless telephones has grown significantly, with such systems offering multiple modes of operation. Wireless telephones configured to operate in a CDMA application provide power efficiencies which improve battery operation time by utilizing less transmit power when signal levels are adequate. In the CDMA type application full power is available up to 28 dbm (600 milliwatts) when it is necessary to communicate with the base station. However, in numerous situations where less power is sufficient, the wireless telephones operate in a back off mode, reducing the power output to 15 dbm (50 milliwatts) which will conserve battery life for the user while providing reliable communications for the user.

The back off mode can be implemented in several ways. One of the more common ways to implement back off mode operation reduces the radio frequency signal amplitude applied to the power amplification stage of the wireless telephone transmitter. This reduces the total power output, and provides some savings in battery power. However, in the backed off mode, the reduced drive to the power amplification stage results in the semiconductor power transistors having a power output efficiency reduced from 40% to as low as 2%. The corresponding efficiency loss for the power amplifier transistors burdens battery life, reducing the total power consumption efficiencies obtained by operating in the back off mode.

The wireless telephone transmitter must also deal with the problem of reflected power, as the antenna used for wireless telephones produces reflected power due to the positioning of the telephone during antenna operation. The reflected power interferes significantly with the linearity of the transmitter power amplification stages, as well as destroys the output power transistor in an extreme case. In the past, circulators have been used to redirect the reflected power directed to a load connected to a port of the circulator. Circulators tend to be lossy, however, further compounding the problem of efficiently producing radio frequency signals.

SUMMARY OF THE INVENTION

The present invention is directed to a power amplification system and method for producing low power radio frequency signals at multiple power output levels. The system and method in accordance with the present invention provides for the operation of power amplification stages at substantially their peak efficiency at multiple power output levels.

The signal to be amplified by the power amplification system is divided into first and second signals. The first and second signals are applied to first and second driver stages where they are amplified to a first level. When the system is to be operated at the higher output power level, the first and second driver stage output signals are further amplified with first and second output amplifiers operating at peak efficiency. The signals from the first and second output amplifiers are recombined in a directional coupler to provide a transmit signal for an antenna. When the system is to be operated in a backed off, low power mode, they are directly connected to the directional coupler for providing the output signal. In either the high power or low power mode of operation, all amplifier stages operate at their peak efficiency and reflected power is diverted to an output port of the coupler, thereby protecting the power amplification system from reflected power.

In a preferred embodiment of the invention, the divided signals are produced by a directional coupler producing first and second quadrature signals. The coupler for recombining the output signals of the first and second output amplifiers or the first or second driver stages, depending on the mode of power operation, is also a directional coupler. By using the directional coupler, it is possible to efficiently and inexpensively couple the signal to an antenna load without suffering effects of reflected power from the antenna load.

DESCRIPTION OF THE PREFERRED EMBODIMENT

Figure 1:
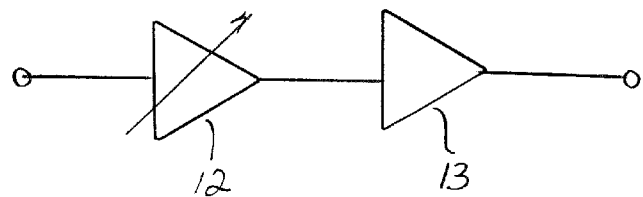
FIG. 1 illustrates a prior art power amplification system for controlling the power level of a radio frequency transmitter.

FIG. 1 illustrates the general configuration of a power amplifier for a radio frequency transmitter having a power output which can be varied, so as to provide a back off operation, wherein less transmit power is needed. A driver amplifier stage 12 is shown connected to a final power amplification stage 13. The stages of amplification 12, 13 are implemented using semiconductor transistors as the active amplifying elements. In a typical CDMA application, a signal input power of 0 dbm is first amplified in driver amplification stage 12, to produce a 15 dbm signal. The 15 dbm power output signal is applied to the final amplification stage 13 to produce the full power 28 dbm transmit level. During the back off mode operation, the driver amplification stage 12 power output is reduced, providing a lower input signal level to the power amplification stage 13. During this mode of operation, a power level of approximately 15 dbm is produced to conserve battery power in those situations where the higher powered transmit signal is unnecessary.

Figure 2:
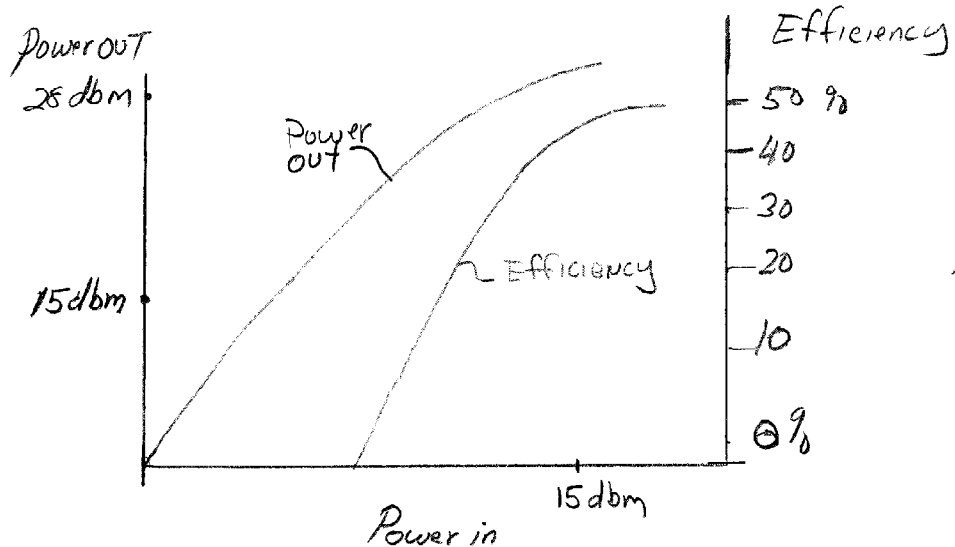
FIG. 2 illustrates the efficiency of a transistor power amplifier as a function of input power.

The effects of reducing the input power to the power amplification stage 13 is shown more particularly in FIG. 2. Referring now to FIG. 2, both power out and efficiency for the power amplification stage 13 are shown as a function of a power input level from the driver stage 12. At full power out, the power in to the power amplification stage 13 is approximately 50 dbm, and the power amplification efficiency and power out are a function of the efficiency of the power amplification stage 13. As can be seen from FIG. 2, as the input power to the device is backed off in order to lower the total output power from 28 dbm to 15 dbm, the efficiency of the device dramatically decreases, to under 10%. Thus, in the backed off mode, while some power savings are achieved by generating a lower power transmit signal, a loss in output power efficiencies are realized when operating at a reduced power input.

In order to obtain the most efficient operation for the power amplification system, the present invention seeks to operate the power amplification stage 13 and driver stages 12 at peak efficiency, in either a full power mode, or backed off power mode operation. An embodiment of the invention for carrying out these objectives is shown in FIG. 3.

Figure 3:
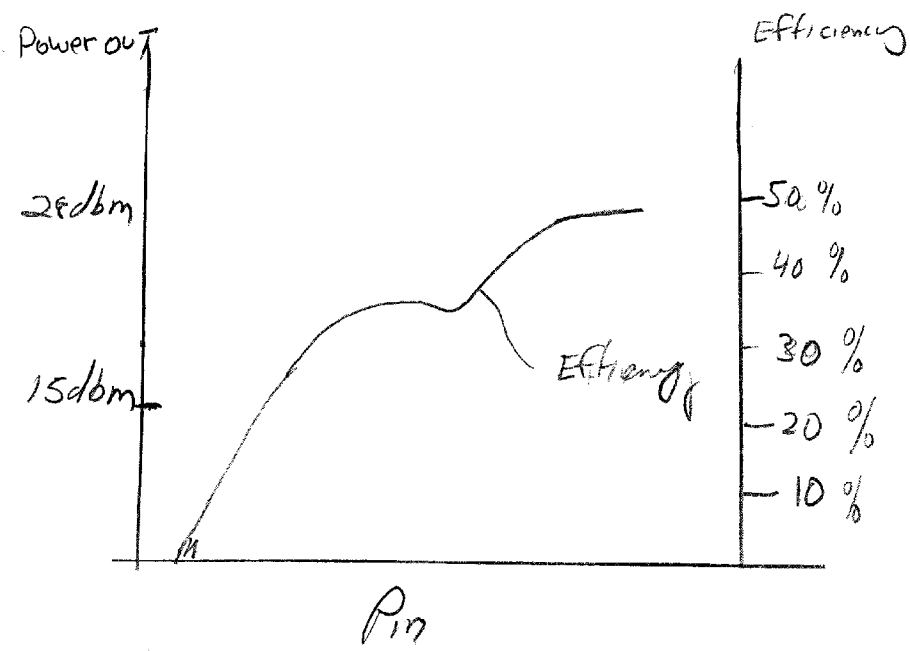
FIG. 3 illustrates a preferred embodiment of the invention for producing different power levels of radio frequency signals at higher efficiencies.

Referring now to FIG. 3, the power amplification system for producing two levels of transmit power is shown. The input signal to be amplified, bearing the modulation to be transmitted as a portion of the transmit signal, is applied to input 18. Input 18 is connected to a directional coupler 20, which has a load impedance 19 connected to the second port of the directional coupler. The directional coupler has two outputs for producing two quadrature signals, each representing half the amplitude of the signal input to terminal 18. The directional coupler outputs are connected through matching networks 21 and 22 to first and second inputs of driver amplifier stages 24 and 23. The matching networks 21 and 22 provide an impedance match between the output ports of coupler 20 and the input terminals of driver amplification stages 23 and 24. Each of the divided signal components are applied to the driver amplification stages 23 and 24 at a substantially constant level.

In a low power mode of operation, a switching means in the preferred embodiment, comprising switch contacts 28 and 30, 32 and 33, connect the output of each of the driver amplification stages 23 and 24 to the input ports of a second directional coupler 44. Matching networks 29 and 31 provide for an optimum power match between the amplification stages 23 and 24 and the inputs to the directional coupler 44. Thus, in a low power mode of operation the signals which were divided by the directional coupler 20 are recombined in the directional coupler 44 after amplification to produce a combined, amplified signal at the output port 45 of directional coupler 45. A second output port 46 of directional coupler 44 is connected to a dummy load 47.

During low power operation, in the event any reflected power appears on the output port 45, due to antenna VSWR, or some other mismatch condition, the reflected power will be directed to the dummy load 47, thus protecting the driver amplification stages 23 and 24 from the reflected power. As is known in the radio communication art, reflected power will reduce the linearity of an amplification stage. The embodiment of FIG. 3 avoids the consequences of reflected power without the use of a ferrite circulator which would introduce more insertion loss and increase the overall cost for the telephone handset.

A high power mode of operation may be achieved with the apparatus of FIG. 3 by operating the switching means so that contacts 28 and 32, 30 and 33 are set to connect the driver amplification stages 23 and 24 to the inputs of output power amplifier stages 38 and 39. At the same time, contacts 32 and 33 connect the outputs of the power amplification stages 38 and 39 through matching networks 40 and 42 to the input ports of directional coupler 44. Matching networks 40 and 42, while shown as individual circuit elements may, of course, be incorporated as part of the power amplification stages 38 and 39.

Figure 4:
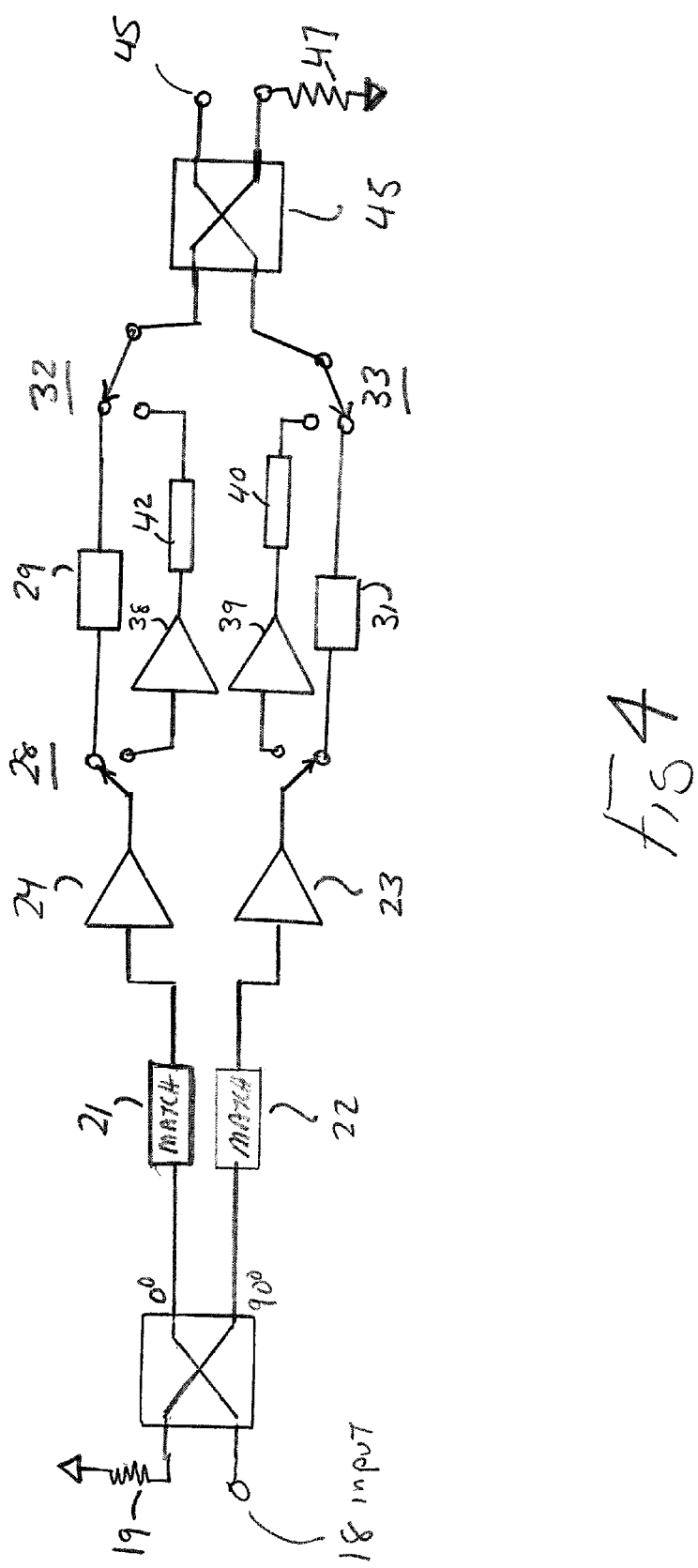
FIG. 4 shows the improvement in radio frequency signal amplification efficiencies using the implementation of FIG. 3.

As shown in FIG. 4, the higher power mode of operation operates at efficiencies which were unobtainable in the conventional driver and power amplification stages shown in FIG. 1. During the high power mode of operation, amplification stages 38 and 39 receive an input signal from driver amplification stages 23 and 24 having a power level of substantially 15 dbm. As shown in FIG. 4, the efficiency obtained in the final amplification stages 38 and 39, is at a substantial maximum of 45% to 50%. During the back off mode, wherein the power levels of the transmit signal are reduced, the output power amplifiers 38 and 39 are switched out of the circuit, and the transmit power is provided through the driver amplification stages 23 and 24. As the input signal drive level to driver amplification stages 23 and 24 has remained the same during the back off mode of operation, the operational efficiency for driver stages 23 and 24 remains the same. Thus, the efficiencies lost through the use of the power amplification stages 38 and 39 are avoided while maintaining the efficiency of the operation for driver amplification stages 23 and 24.

As FIG. 4 shows, during the back off mode of operation efficiencies during low power operation remain above 20% contributing to the battery life for the telephone transmitter.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A power amplification system for a low power radio frequency signal comprising:

a first coupler for receiving a signal to be amplified and splitting said signal into first and second components;

a first driver stage connected to amplify said first component;

a second driver stage connected to amplify said second component;

a first output amplifier;

a second output amplifier;

a second coupler; and switching means for connecting said first and second driver stages to inputs of said first and second amplifiers, and said first and second amplifiers to said second coupler during a high power operation, and for connecting said first and second driver stages to said second coupler during low power operation.

2. A power amplification system according to claim 1, further comprising first and second matching networks for matching said first and second driver stages to said second coupler during low power operation so that said amplifiers operate at peak efficiency during low power operation.

3. The power amplification system according to claim 1 wherein said second coupler has first and second output ports, said first output port being adapted for connection to an antenna, and said second output port having a load impedance which absorbs reflected power produced from an antenna connected to said first port.

4. The power amplification system according to claim 2 further comprising third and fourth matching networks for matching input impedances of said first and second driver stages to ports of said first coupler which provide said first and second signals.

5. The power amplification system according to claim 1 wherein said first and second couplers are directional couplers.

6. A method of providing multiple power levels of radio frequency signals comprising:

dividing a low power radio frequency signal into first and second signal components;

amplifying each of said first and second signal component in first and second driver stage amplifiers;

during a high power operation mode, supplying signals from said first and second driver stages to first and second power amplifiers operating at substantially peak efficiency, and combining signals from said first and second power amplifiers to derive an output signal which is the sum of the signals from said first and second power amplifiers; and during a low power operating mode, combining signals from said first and second driver stages to derive an output signal.

7. The method according to claim 6, wherein said first and second signal components are in phase quadrature.

8. The method according to claim 6 wherein during said high power operating mode said signals from said first and second amplifiers are combined in phase quadrature to produce said output signal.

9. The method according to claim 6 wherein said signals from said first and second power amplifiers are combined in a directional coupler which provides said combined signals to an antenna.

10. The method according to claim 6 wherein signals from said driver amplifier stages are combined in a directional coupler, which provides said combined signals to an antenna during said low power mode of operation.

11. The method according to claim 6 further comprising, during said low power mode of operation, changing the output impedance of said driver amplifiers before combining said signals.

* * * * *